United States Patent
Nagamoto

[11] Patent Number: 6,116,487
[45] Date of Patent: Sep. 12, 2000

[54] METHOD AND APPARATUS FOR SWEEPING OVERFLOWED RESIN ON SEMICONDUCTOR DEVICE MANUFACTURING PROCESS

[75] Inventor: Nobuhiro Nagamoto, Oita, Japan

[73] Assignee: Sony Corporation, Tokyo, Japan

[21] Appl. No.: 08/847,758

[22] Filed: Apr. 23, 1997

[30] Foreign Application Priority Data

Apr. 26, 1996 [JP] Japan ................................ 8-106593

[51] Int. Cl.[7] .............................. H01L 21/48; B26F 3/00
[52] U.S. Cl. .............................. 225/1; 225/93; 225/103; 438/461
[58] Field of Search .............................. 225/1, 2, 93, 94, 225/103, 104, 93.5, 97, 105; 438/115, 690, 458, 460, 461, 691

[56] References Cited

U.S. PATENT DOCUMENTS

| | | | |
|---|---|---|---|
| 37,189 | 12/1862 | Westlake | 225/1 |
| 2,039,840 | 5/1936 | Howland-Shearman | 225/93 X |
| 2,039,841 | 5/1936 | Howland-Shearman | 225/93 X |

*Primary Examiner*—Clark F. Dexter
*Attorney, Agent, or Firm*—Hill & Simpson

[57] ABSTRACT

A method of sweeping overflowed resin on a semiconductor device manufacturing process and an apparatus using the method are provided. The method comprises the steps of applying a breaking force to part of the top or back face of overflowed resin, which is leaked in resin-sealing the semiconductor device and stuck on the side wall surface of the lead, dam bar, etc. to be filled and hardened in each opening formed by the boundaries of the lead, dam bar, etc., so as to separate the overflowed resin into a separated resin piece and a residual resin remained sticking on the side wall surface of the lead, dam bar, etc.; making the separated resin piece come into contact with residual resin via the ruptured face; and applying a pressing-through force to part of the top or back face of the separated resin piece in the opposite direction to the breaking force to effectively separate and sweep at least part of the stuck residual resin via the separated resin piece.

4 Claims, 8 Drawing Sheets

METHOD AND APPARATUS FOR SWEEPING OVERFLOWED RESIN ON SEMICONDUCTOR DEVICE MANUFACTURING PROCESS

BACKGROUND OF THE INVENTION

1. Field of the Invention

This invention relates to a method and an apparatus for sweeping overflowed resin on a semiconductor device manufacturing process, particularly to a method and an apparatus for sweeping overflowed resin stuck in between leads in resin-sealing the semiconductor device.

2. Description of the Related Art

Figure 1:
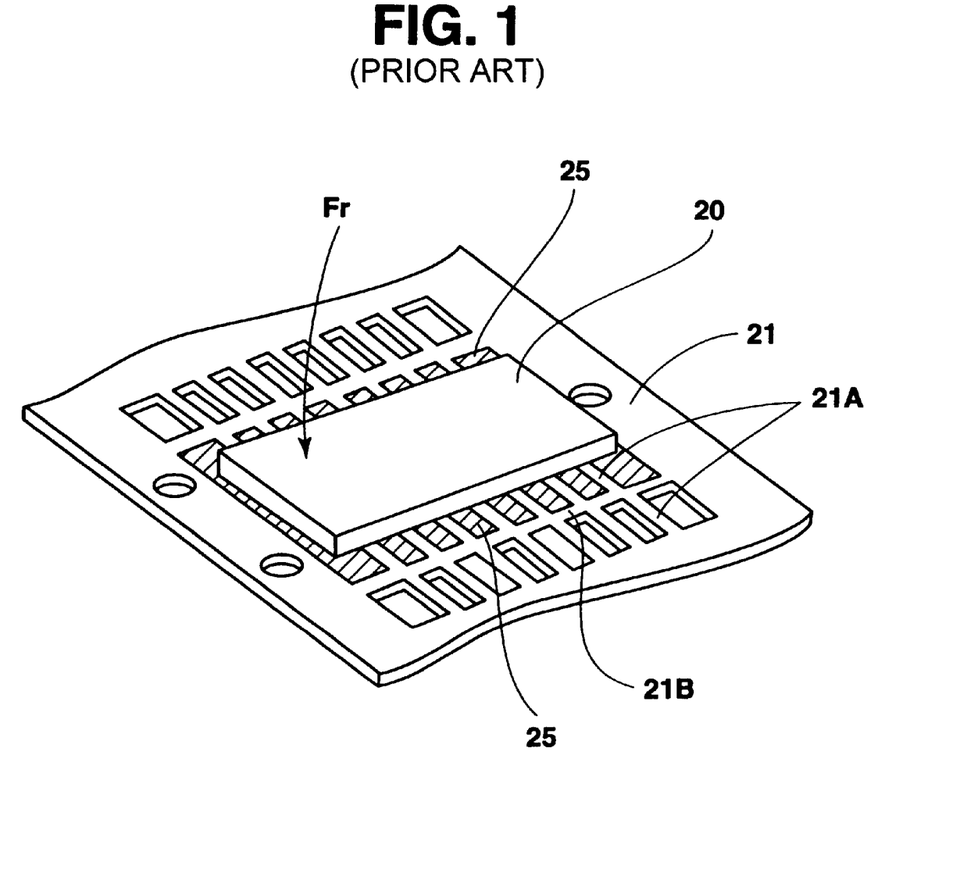
FIG. 1 is a perspective view showing an ordinary resin-sealed semiconductor device.

Resin is injected in a cavity of a semiconductor device package in a resin sealing process on the semiconductor device manufacturing process. FIG. 1 is a perspective view showing a semiconductor device for which such a resin sealing process is finished.

The lead frame 21 is provided with a plurality of leads 21A protruded in one or a plurality of directions and dam bars 21B for connecting those leads 21A. A semiconductor chip wire-bonded to a plurality of the leads 21A is sealed by thermosetting resin in the package 20. As the thermosetting resin, generally biphenyl epoxy resin is used. In FIG. 1, Fr indicates the top side of the package 20.

In resin sealing, unhardened state resin often leaks from a gap between upper and lower dies corresponding to the thickness of the lead frame 21A positioned between those dies. Leaked resin is then filled in openings like quadrate slots formed with boundaries of the package 20, the leads 21A, and the dam bar 21B and hardened by three-dimensional crosslinking as it is cooled down, resulting in forming of overflowed resin 25. This overflowed resin 25 is removed using a pressing machine, etc. after the resin sealing process is ended.

Figure 2:
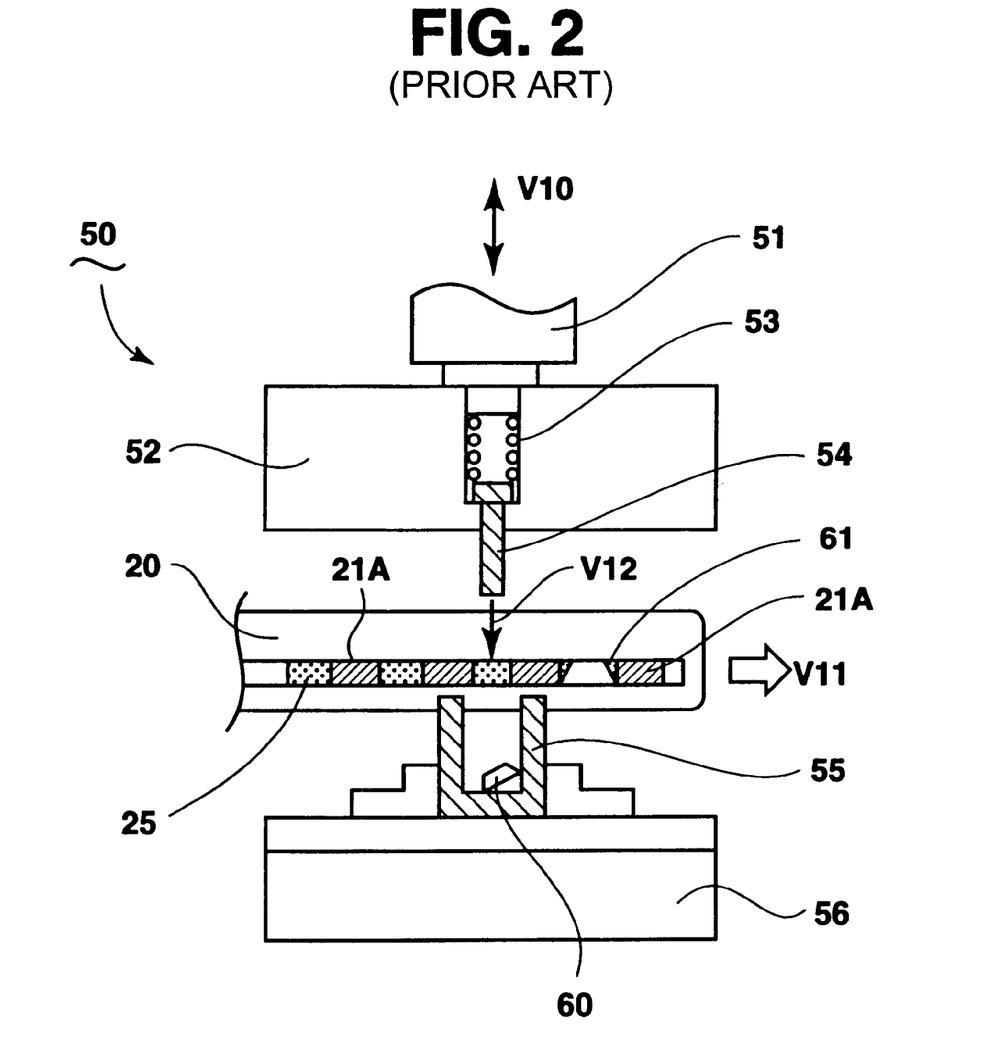
FIG. 2 is a cross sectional view showing a related art overflowed resin sweeping apparatus.
Figure 3:
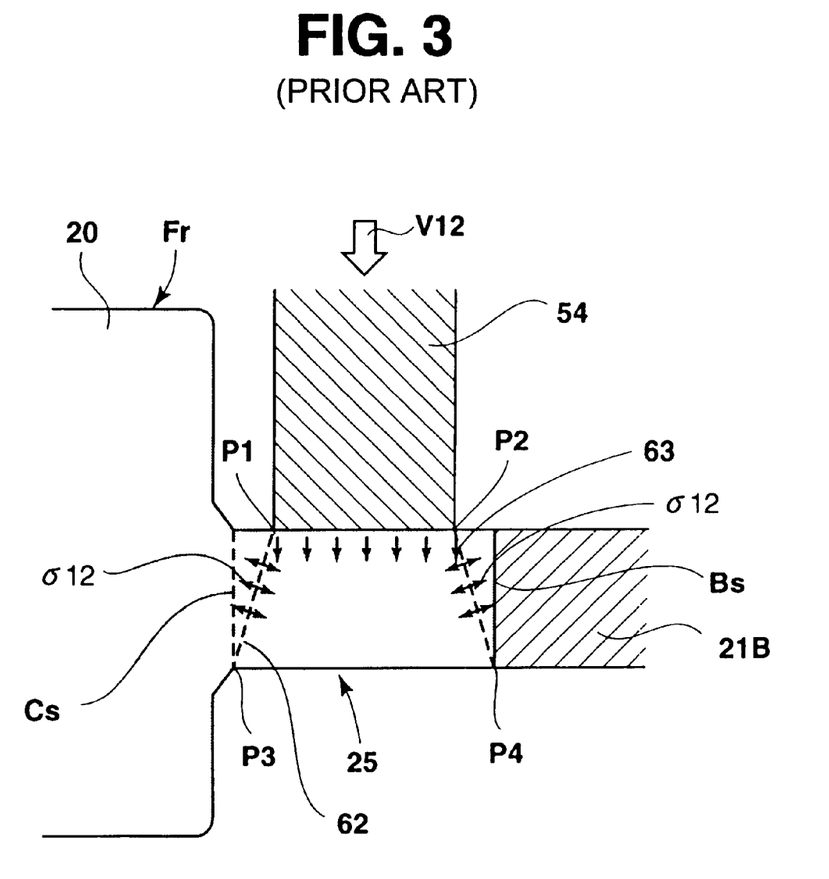
FIG. 3 is a view explaining how an overflowed resin is swept by a method of sweeping overflowed resin in a semiconductor device manufacturing process in the related art.
Figure 4:
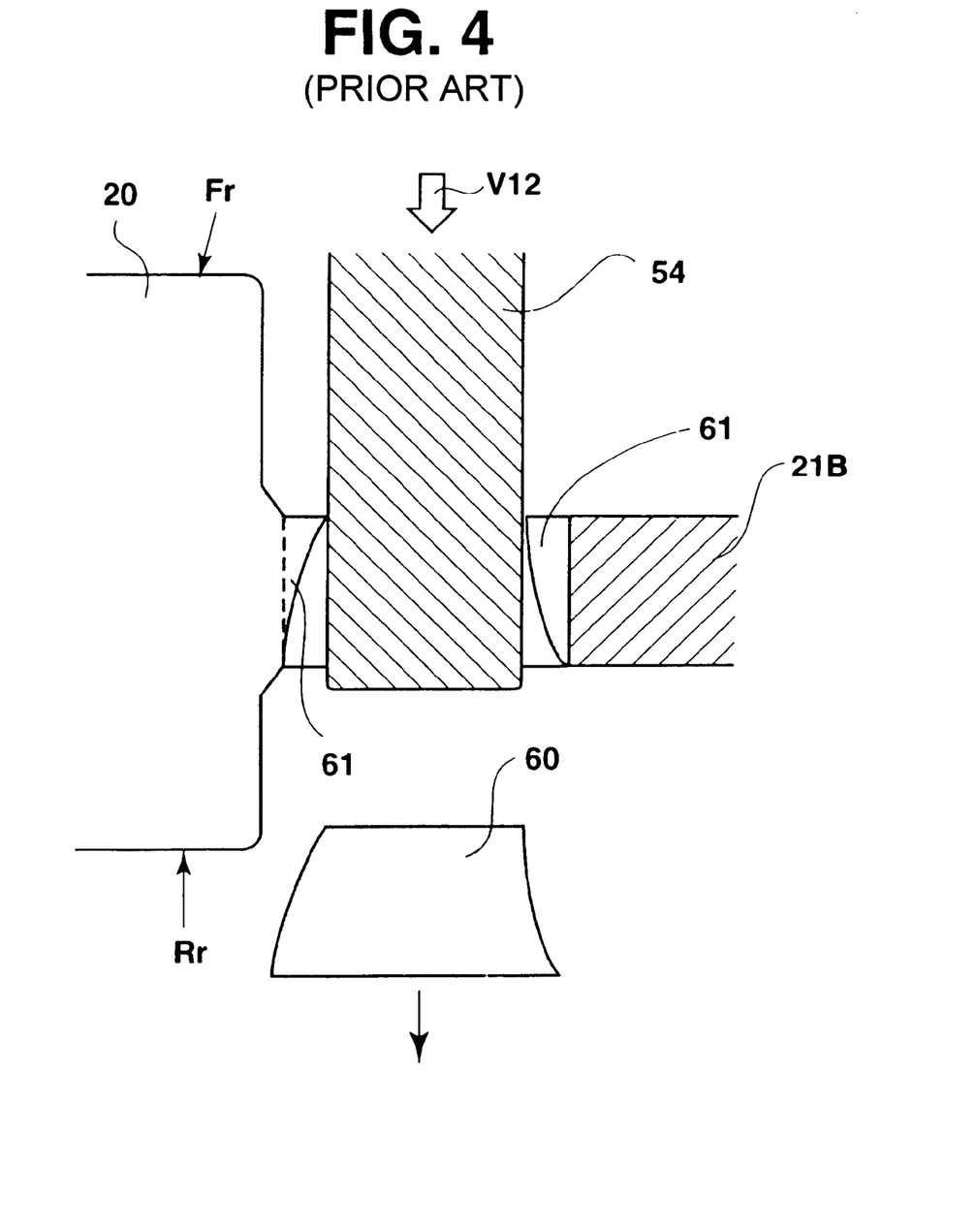
FIG. 4 is a view showing the state at the end of a resin sweeping action in the related art.
Figure 5:
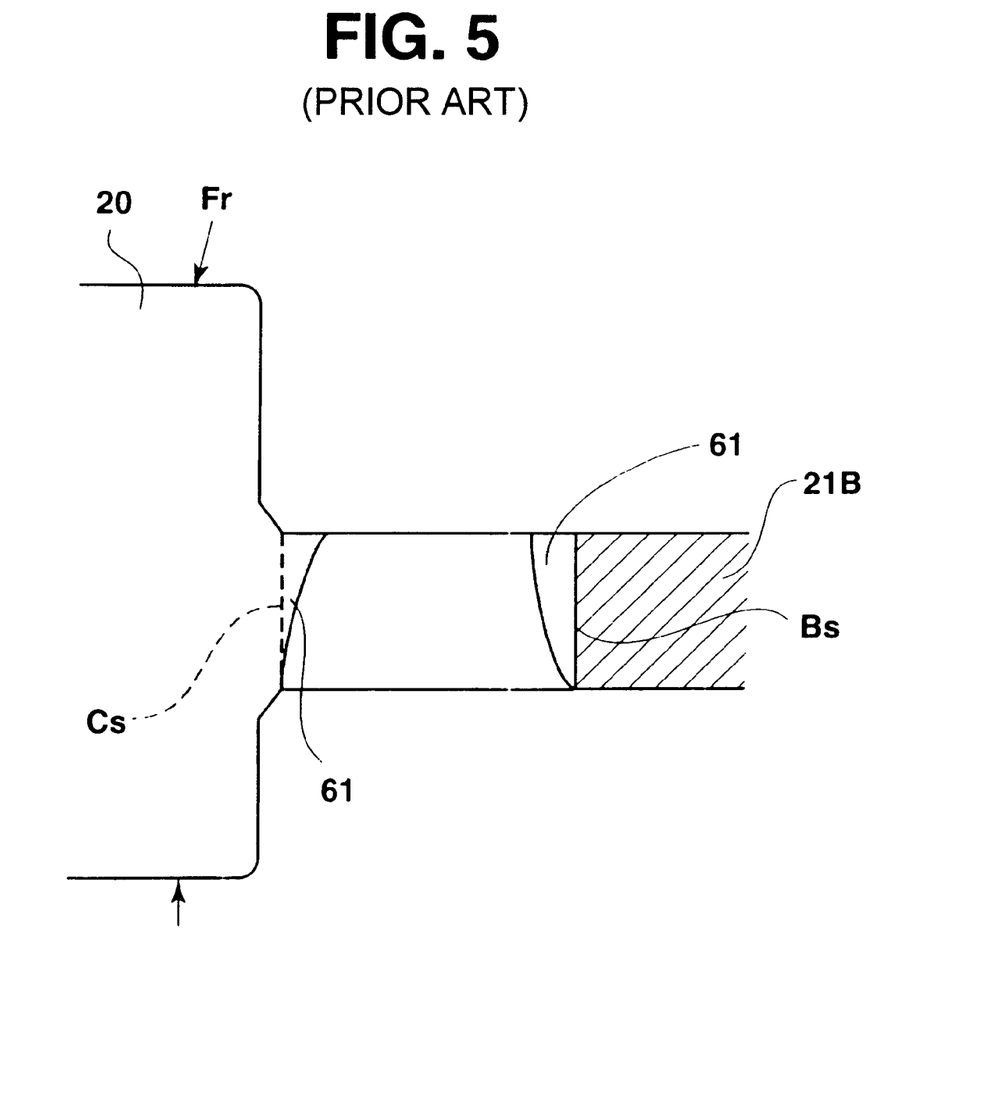
FIG. 5 is a cross sectional view showing a state of an overflowed resin in the prior art after the sweeping action is ended.

FIG. 2 is a cross sectional view showing such a related art apparatus for sweeping overflowed resin. FIG. 3 explains how the overflowed resin is swept using a related art method of sweeping overflowed resin on the semiconductor device manufacturing proces. FIG. 4 is a view explaining the end of the overflowed resin sweeping. FIG. 5 is a cross sectional view of a state after overflowed resin is swept using a related art method. Hereunder, how to sweep the overflowed resin from a semiconductor device will be explained with reference to those drawings.

In FIG. 2, the overflowed resin sweeping apparatus 50 of the pressing machine structure comprises a punch holder base 52 moving up/down according to the up/down motion of a shank 51 as shown by an arrow mark V10; a punch 54 built in the punch holder base 52 so as to be protruded downward and energized by a spring 53 for being pressed; and a base frame 56 provided with an approximately U-shaped lead frame holder 55 on its top and away from the punch holder base 52 downward.

The package 20 in which a semiconductor chip is sealed by resin is inserted in between the punch holder base 52 and the base frame 56 so that two leads 21A can respectively come in contact with both tips of the approximately U-shaped lead frame holder 55. In this state, the overflowed resin 25 between those leads 21A still remains inside both tips of the lead frame holder 55.

At this time, the punch holder base 52 is driven by the shank 51 to go down in the direction of the arrow mark V12 (moving toward the punch) so that the tip of the punch contacts the overflowed resin 25, then it is pressed against the resin 25 strongly to make the resin 25 be separated from the side wall surface of the lead frame 21 and be discharged as punched resin 60.

To prevent resin (not separated yet) from remaining on the side wall surfaces of the package, the leads, etc. at this time, the clearances from the package, the leads, and the punch must be minimized and the positions of the punch, the package, and the leads must be controlled properly to achieve the object. This is so difficult, however, as to be almost impossible under the present circumstances. Furthermore, if the above clearance is small, the punch comes in contact with both the package and the leads even by a very small positional error, resulting in partial damage of the leads.

In related art techniques, an attempt is made to design the tip of the punch 54 smaller than the gap between leads, that is, smaller than the size of overflowed resin 25 to prevent such a problem.

As a result, the punch 54 contacts the upper side (Fr side in FIG. 3) of overflowed resin 25 and presses it down to generate a stress inside the overflowed resin 25, so that the stress concentration is induced at ends P1 and P2 of the punch 54. Furthermore, the stress concentration is induced at the lower end P3 of the boundary Cs between the package 20 and the overflowed resin 25, as well as at the lower end P4 of the boundary Bs between the dam bar 21B and the overflowed resin 25. The stress σ12 in the overflowed resin 25 is concentrated on the face 62 between the end P1 and the lower end P3, and on the face 63 between the end P2 and the lower end P4, respectively.

When the punch 54 further goes down, the stress reaches the breaking stress due to a static load to generate a crack on the faces 62 and 63 of the overflowed resin or in the neighbourhood thereof along a three-dimensional crosslinked chain and results in a brittle rupture. In other words, such a crack grows into a rupture face so that the overflowed resin 25 is ruptured and the ruptured resin 60 is separated from the lead frame 21 and dropped away as shown in FIG. 4.

In the above related art techniques for sweeping the overflowed resin, however, unseparated resin 61 is left on the side wall surfaces of the package and each lead as shown in FIG. 4 and FIG. 5. This is because a crack occurs from the side of the cutting edge of the punch as mentioned above before a shear stress between side wall surfaces of the package and the lead increases around the upper end of the boundary of overflowed resin 25.

This residual resin drops off in a subsequent process or after product delivery to be foreign matters which cause an accident due to imperfect operation of an apparatus using the device, or a problem of product quality deterioration, etc.

OBJECT AND SUMMARY OF THE INVENTION

In order to solve the above problems and defects of the related art techniques, it is an object of this invention to eliminate failures in sweeping unnecessary resin after a package for a semiconductor device is sealed by resin, prevent residual resin from being left at side surfaces of each lead, etc. and provide a method and an apparatus for sweeping overflowed resin on semiconductor device manufacturing that can carry out assembling, measuring, and mounting processes smoothly after the resin sweeping process.

The method of sweeping overflowed resin on semiconductor manufacturing according to this invention comprises the first step of applying a breaking force to part of the top or back face of the overflowed resin inside the opening to cause a brittle rupture in the overflowed resin so as to form a ruptured face that separates the overflowed resin into a separated resin piece and a residual resin stuck on the side wall surface of the lead, dam bar, or package; the second step of keeping the separated resin piece to be in contact with the residual resin via the ruptured face; and the third step of applying a pressing-through force to part of the back or top face of the separated resin piece in the opposite direction to the breaking force to separate and sweep at least part of the residual resin from the side wall surface of the lead, dam bar, or package via the separated resin piece.

The apparatus for sweeping overflowed resin on semiconductor device manufacturing process according to this invention comprises a separating punch whose tip has a size is smaller than that of the opening and is able to apply a pressure vertically to the overflowed resin inside the opening by contacting part of the top or back face of overflowed resin; the first forcing mechanism as first forcing means for applying the separating punch a breaking force to cause a brittle rupture in the overflowed resin to form a ruptured face that separates the overflowed resin into a separated resin piece and a residual resin stuck on the side wall surface of the lead, dam bar, or package; the first holder mechanism which has a recess at a free end and contacts the lead, dam bar, or package around the overflowed resin with the free end with the recess bridging over the opening when the breaking force is applied to the overflowed resin via the separating punch so as to apply a force to the lead, dam bar, or package in the opposite direction to the breaking force and keeps the separated resin piece in contact with the residual resin via the ruptured face; a stripping punch whose tip has a size is smaller than that of the overflowed resin and presses part of the back or top face of the above separated resin piece with the tip to apply a pressing-through force in the opposite direction to the breaking force to the residual resin stuck on the side wall surface of the lead, dam bar, or package via the separated resin piece so as to separate at least part of the residual resin; the second forcing mechanism as second forcing means for applying the pressing-through force to the stripping punch; and the second holder mechanism which has two protrusions disposed with a distance larger than the size of the opening and contacts the lead, dam bar, or package around the separated resin piece with the protrusions making the second holder mechanism bridge over the opening so as to apply a force in the opposite direction to the pressing-through force to the lead, dam bar and package when the pressing-through force is applied to the separated resin piece via the stripping punch.

According to the method of sweeping overflowed resin provided by this invention, a breaking force to cause a brittle rupture is applied to part of the overflowed resin surface to form a ruptured face on the overflowed resin in the first step. Consequently, the overflowed resin is separated into a single separated resin piece and a residual resin remained sticking on the wall surface. Then, in the second step, the separated resin piece is kept in contact with the residual resin via the ruptured face, and in the third step, a pressing-through force is applied to the separated resin piece in the opposite direction to the breaking force, so that the separated resin piece equal in size to the residual resin works as a punch on the ruptured plane. Thus, residual resin stuck on the wall surface of the lead, dam bar, or package can be separated and swept effectively.

Above all, when a breaking force is applied to overflowed resin in the first step, if the lead, dam bar, or package at the outer periphery of the overflowed resin is pressed in the opposite direction to the breaking force, then the overflowed resin can be separated into a single separated resin piece and a residual resin more effectively.

In the same way, if, when a pressing-through force is applied to the separated resin piece, if the lead, dam bar, or package at the outer periphery of the opening is pressed in the opposite direction to the pressing-through force, then residual resin is separated and swept away more effectively.

Furthermore, if overflowed resin is put almost horizontally, the breaking force in the first step is applied from bottom to top and the pressing-through force in the third step is applied from top to bottom, then the resin piece after being separated in the first step is put on the residual resin. Thus, the separated resin piece never drops off while being conveyed to the next process or treated in the subsequent process.

The apparatus for sweeping overflowed resin according to this invention comprises a separating punch whose tip is smaller than the cavity; and the first forcing mechanism for applying a breaking force to the separating punch; and the first holder mechanism coming into contact with leads, etc. around overflowed resin. They cause a brittle rupture in the overflowed resin, so that the overflowed resin is separated into a separated resin piece and a residual resin. The separated resin piece has a ruptured face equal in size to the residual resin.

Furthermore, since the first holder mechanism makes the separated resin piece come in contact with the residual resin via the ruptureed face and this state is remained, the separated resin piece is not scattered nor lost, so that it can be conveyed to the next process or treated easily in the subsequent processes without any problem.

Furthermore, the apparatus further comprises a stripping punch whose tip is smaller than the overflowed resin; the second forcing mechanism for applying a pressing-through force to the stripping punch in the opposite direction to the breaking force; and the second holder mechanism coming into contact with leads, etc. around the separated resin piece and applying a force to the leads, etc. in the opposite direction to the pressing-through force, and allows the separated resin piece whose ruptured face is equal in size to the residual resin to work as a punch, so that the separated resin piece presses through the residual resin stuck on the side wall surface of the lead, dam bar, or package with the entire rupture face to separate and sweep the residual resin effectively.

In this case, if the first forcing mechanism for applying a breaking force to the residual resin is made of an inexpensive elastic body, such as a coil spring, spring, flat spring, rubber, elastomer, or the like, a ruptured face can be formed with a lower cost.

In the same way, if the first forcing mechanism is a fluid mechanism using air pressure, oil pressure, or water pressure, or it is formed by a mechanism using an electromagnetic force such as an electromagnet, solenoid, or the like, a strong force of the mechanism causes a brittle rupture to occur more satisfactorily and surely.

Furthermore, if the second forcing mechanism for applying a pressing-through force to the residual resin is made of an inexpensive elastic body, such as a coil spring, spring, flat spring, rubber, elastomer, or the like, the residual resin can be separated and swept with a lower cost.

In the same way, if the second forcing mechanism is a fluid mechanism using air pressure, oil pressure, or water pressure, or it is formed by a mechanism using an electromagnetic force of an electromagnet, solenoid, or the like, the residual resin will be separated and swept more satisfactorily and surely by a strong force of the mechanism.

Furthermore, if the tip of the separating punch is flat and the tip area is 0.45 to 0.85 times the area of overflowed resin, then a ruptured face is formed inside the overflowed resin so that it is opened toward the boundary on the surface opposite to the surface to which the tip of the separating punch is applied is formed inside the overflowed resin.

If the tip of the separating punch is formed as a quadangle including square and rectangle, or at least part of the tip is formed with a curve including a circle and elliptical, then a ruptured face is formed effectively so that it is opened toward the boundary on the surface opposite to the surface to which the tip of the separating punch is applied.

Furthermore, if the tip of the stripping punch is flat and the tip area is 0.45 to 0.85 times the area of overflowed resin, then a pressing-through force is applied to the ruptured face of a separated resin piece in uniform. As a result, the separated resin piece whose ruptured face is equal in size to the residual resin works as a punch to separate and sweep the residual resin from the side wall surface of the lead, dam bar, or package effectively.

If the tip of the stripping punch is formed as a quadangle including square and rectangle, or at least part of the tip is formed with a curve including circle and ellipse, then a pressing-through force is applied to the ruptured face of the separated resin piece in uniform, so that residual resin can be separated and swept effectively.

As explained above, this invention can improve significantly the sweeping effect of the residual resin leaked in resin-sealing the semiconductor device and stuck between leads and eliminate failure in sweeping unnecessary resin to prevent residual resin from dropping off from the side wall surface of each lead when the semiconductor device is mounted. Consequently, this invention can solve problems of foreign matters entering into electronic devices, as well as enables smooth execution of assembly, measurement, and mounting processes coming after the resin-sealing process.

This invention can also eliminate such a troublesome process as removing of foreign matters from electronic devices after they are assembled, improving each of manufacturing, adjusting, and maintenance processes and reducing manufacturing costs. And, especially, this invention can assure quality and reliability of products, realizing a remarkable effect in the semiconductor industry.

DETAILED DESCRIPTION OF PREFERRED EMBODIMENTS

Hereunder, this invention will be explained with reference to attached drawings.

Figure 6:
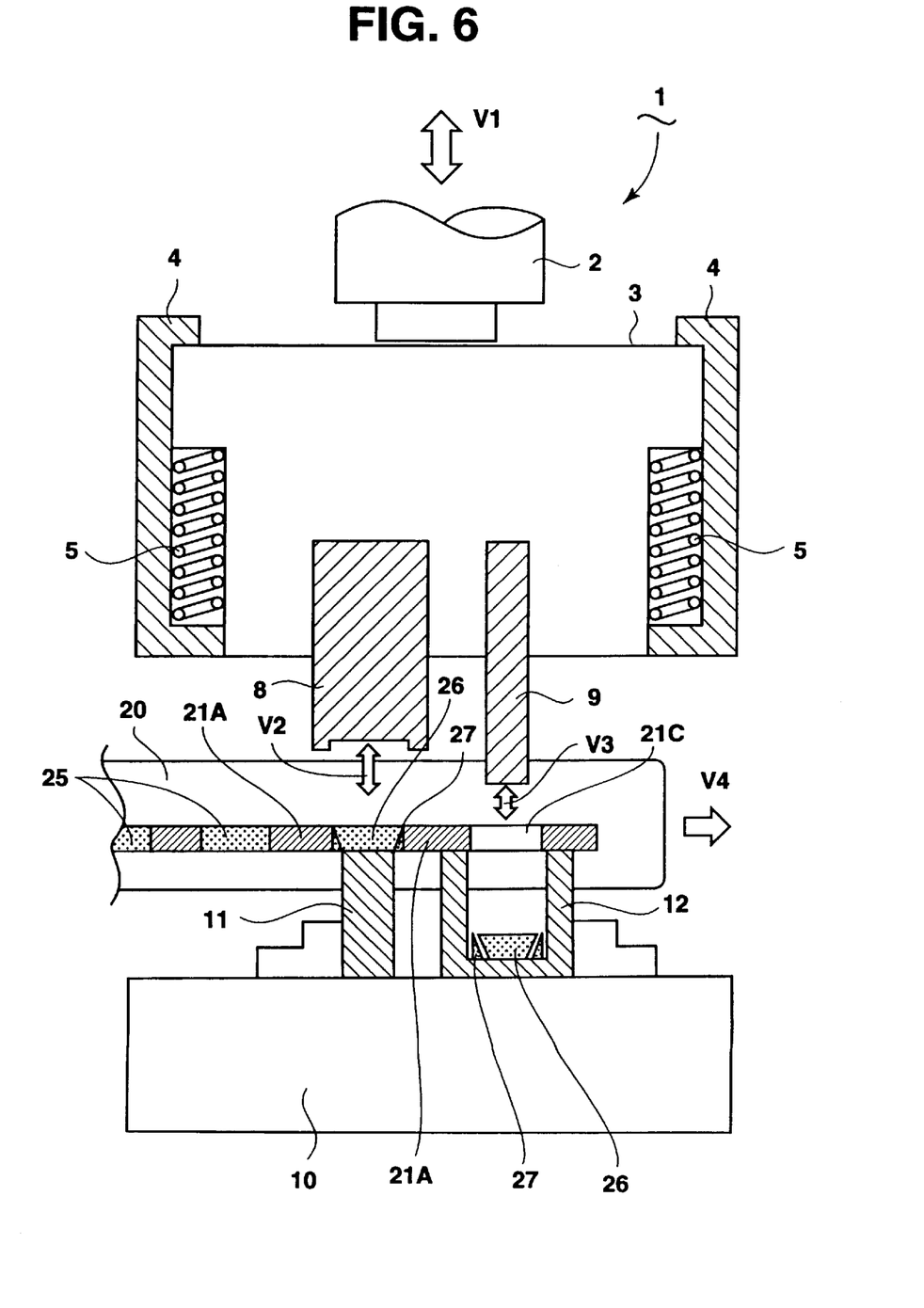
FIG. 6 is a cross sectional view showing an embodiment of the overflowed resin sweeping apparatus used in a semiconductor device manufacturing process according to this invention.

As shown in FIG. 6, a resin sweeping apparatus 1 according to an embodiment of this invention has a structure of a pressing mechanism, which is provided with a pair of dies comprising a frame 3 located in the upper portion and a base 10 located in the lower portion. The frame 3 is guided to move up/down accurately by a frame guide 4. The frame 3 is also forced upward by a spring 5 and is moved downward by a shank 2, which is connected to a press driving source that drives the shank 2 upward/downward (in the directions shown by the arrow marked V1).

The frame 3 holds the first lead frame holder 8 protruded downward and a stripping punch 9, both are laterally arranged side by side. At the lower end face of the first lead frame holder 8 is formed a recess 8A (see FIG. 7) and at the edge of the lower end face are formed contact faces 8B (see FIG. 7) coming into contact with two leads 21A from above by bridging over the overflowed resin 25.

The lower end face of the stripping punch 9 is formed smaller than the slot 21C as an opening formed at each boundary of the lead 21A, dam bar 21B, or package 20. The lower end face of the stripping punch 9 is protruded lower than the lower end face of the first lead frame holder 8.

On the other hand, a separating punch 11 rises straight from the base 10 facing the first lead frame holder 8, and the second lead frame holder 12 rises straight on the side of the separating punch 11 and facing the stripping punch 9.

The top face of the separating punch 11 is formed smaller than the slot 21C as an opening formed at each boundary of the lead 21A, dam bar 21B, or package 20. The second lead frame holder 12 is U-shaped with the two protrusions disposed with a distance a little larger than the size of the slot and the top faces thereof come in contact with two leads 21A.

The lead frame 21 of the package 20 in which a semiconductor is resin-sealed is inserted between the first lead frame holder 8 and the separating punch 11 and between the stripping punch 9 and the second lead frame holder 12, respectively.

The central part of the overflowed resin 25 between two leads 21A is positioned almost in the center of the separating punch 11 and the adjacent two leads 21A come in contact with both the top faces of the protrusions of the U-shaped second lead frame holder 12. In this state, the overflowed resin 25 between leads 21A is positioned between the top faces of the second lead frame holder 12.

Subsequently, a resin sweeping action will be explained. At first, a lead frame 21 is supplied from a supplier (not illustrated) and positioned as specified, then the frame 3 is moved down in the direction as shown by the arrow marked V1 by driving the shank 2. With this motion, both the first lead frame holder 8 and the stripping punch 9 are simultaneously moved down as shown by arrow marks V2 and V3, respectively. However, since the stripping punch 9 is protruded downward lower than the first lead frame holder 8, the stripping punch 9 comes in contact with the lead frame 21 first to apply a force to the lead frame 21 together with the second lead frame holder 12. After this, the first lead frame holder 8 applies a force to the lead frame 21 together with the separating punch 11. Each part of the resin sweeping apparatus of this invention takes its action with the sequence as explained briefly above, but, for convenience, the actions of the separating punch 11 and the first lead frame holder 8 will be first explained below a little more in detail.

Figure 7:
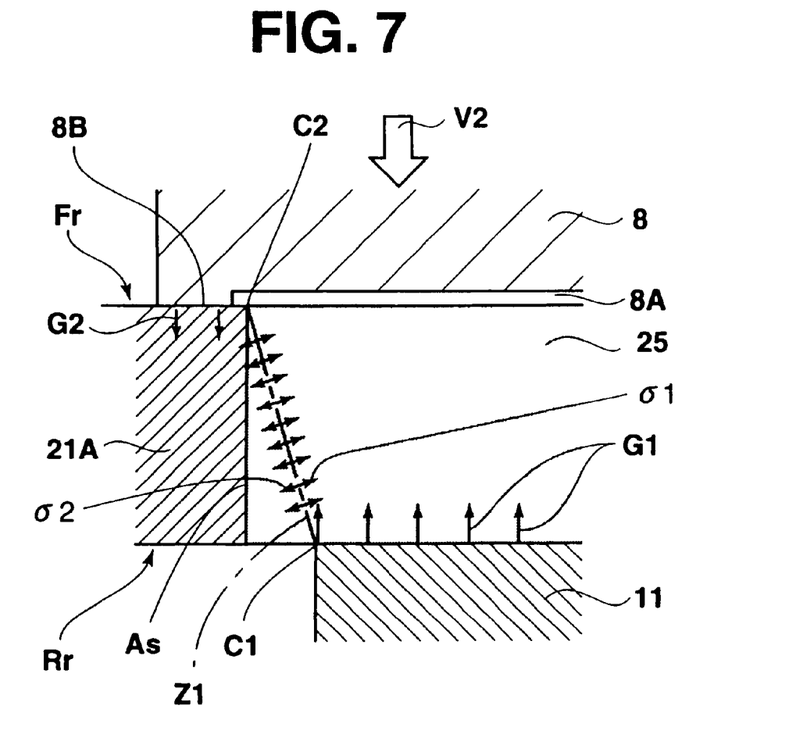
FIG. 7 is a view explaining how an overflowed resin is separated into a separated resin piece by an embodiment of the method of sweeping overflowed resin on a semiconductor device manufacturing process according to this invention.

In FIG. 7, when the contact face 8B, which is at the edge of the bottom face of the first lead frame holder 8, comes in contact with two leads 21A from above Fr and presses them down (only the left lead is shown in FIG. 7) over the overflowed resin 25, a force G2 is applied to those leads 21A. Meanwhile, a reaction force G1 is applied to the overflowed resin 25 in contact with the separating punch 11. Those forces cause a stress to be distributed in the overflowed resin 25, but the stress concentration is induced only at the ends C1 and C2 as mentioned above. For example, a stress $\sigma 1$ is induced on a face Z1, which connects the ends C1 and C2. This stress $\sigma 1$ reaches a breaking stress causing a crack along the face Z1 that leads to a rupture to form a ruptured face.

This rupture causes overflowed resin 25 to be separated into a single separated resin piece 26 and a residual resin 27 remained sticking on the boundary face As of the lead frame. At this time, the size and shape of the ruptured face 26A of the separated resin piece becomes equal to those of the ruptured face 27A of the residual resin 27. In many cases, the ruptured face 26A of the separated resin piece 26 is opened toward the top from the bottom to give the separated resin piece 26 a fan-like cross sectional shape.

Figure 8:
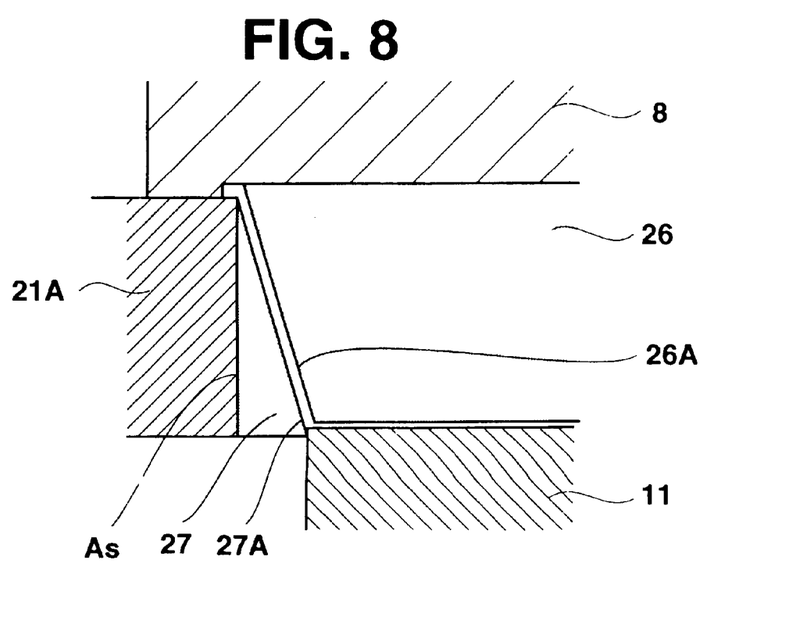
FIG. 8 is a view showing a state of a separated resin piece after having been separated by an embodiment of the method of sweeping overflowed resin on a semiconductor device manufacturing process according to this invention.

The separated resin piece 26 goes into the recess 8A of the first lead frame holder 8 and is stopped when the top face butts the face of the recess 8A. Thus, the separated resin piece 26 is never scattered and lost in this stage.

When separation of overflowed resin 25 is ended as explained above, the frame 3 goes up once, and the package 20 and the lead frame 21 are fed to the right (in the V4 direction) as shown in FIG. 6 and two leads 21A holding both separated resin piece 26 and residual resin 27 produced in the above process are put on the second lead frame holder 12.

Figure 9:
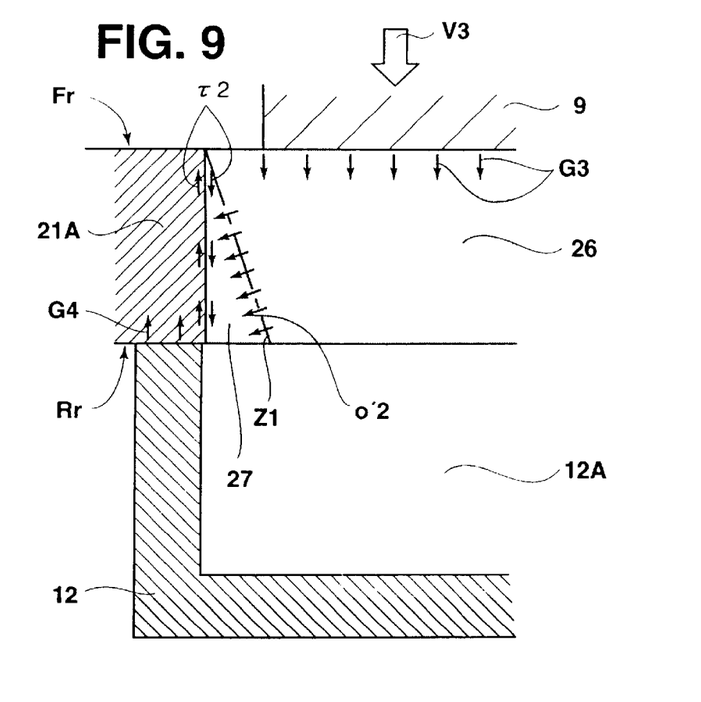
FIG. 9 is a view explaining a residual resin stripping action using an embodiment of the method of sweeping overflowed resin on a semiconductor device manufacturing process according to this invention.

After this, the stripping punch 9 goes down as shown by an arrow mark V3, and the lower end comes into contact with the top face of the separated resin piece 26 as shown in FIG. 9, then the punch 9 presses the resin 26 down strongly.

Consequently, a pressing-through force G3 is applied to the separated resin piece 26. Meanwhile, a reaction force G4 is applied to the leads 21A. Of those forces, the pressing-through force G3 applied to the separated resin piece 26 induces a stress $\sigma 2$ in the residual resin 27 via a ruptured face. This stress $\sigma 2$ is induced all over the ruptured face.

Figure 10:
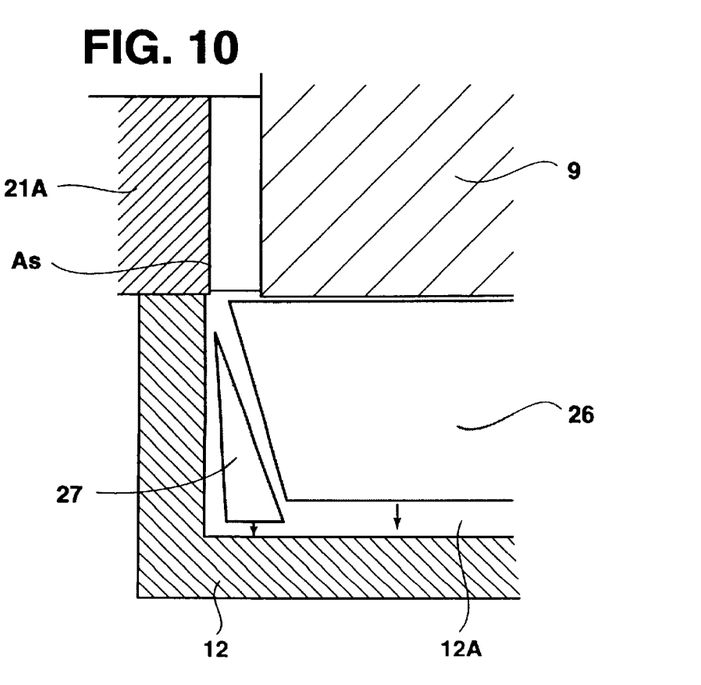
FIG. 10 is a view showing a state when a residual resin stripping action is ended by an embodiment of the method of sweeping overflowed resin on a semiconductor device manufacturing process according to this invention.

As a result of action of each force above, a large shearing stress $\tau 2$ is induced all over the boundary between lead 21A and residual resin 27, so that the residual resin 27 is separated from the leads 21A as shown in FIG. 10 and dropped into the second lead frame holder 12.

In the above apparatus configuration as an embodiment of this invention, a combination of the shank 2, the frame 3, and the frame guide 4 forms a common mechanism shared by the first forcing mechanism as first forcing means for applying the breaking force and by the second forcing mechanism as second forcing means for applying the pressing-through force. Furthermore, the first lead frame holder 8 forms the first holder mechanism and the second lead frame holder 12 forms the second holder mechanism.

If the first forcing mechanism that applies the breaking force is formed by an elastic body such as a coil spring, spring, flat spring, rubber, elastomer, or the like, the ruptured face can be formed at a lower cost.

If the first forcing mechanism that applies the breaking force is formed by a fluid mechanism using air pressure, oil pressure, water pressure, or the like, or it is formed by a mechanism using an electromagnetic force of an electromagnet, solenoid, or the like, then a brittle rupture will be generated surely.

If the second forcing mechanism that applies the pressing-through force is formed by an elastic body such as a coil spring, spring, flat spring, rubber, elastomer, or the like, the residual resin can be separated and swept at a lower cost.

If the second forcing mechanism that applies the pressing-through force is formed by a fluid mechanism using air pressure, oil pressure, water pressure, or the like, or it is formed by an electromagnetic mechanism using an electromagnetic force of an electromagnet, solenoid, or the like, then residual resin will be separated and swept satisfactorily and surely.

The tip of the separating punch 11 is preferably formed flat, and the area of the tip is preferably 0.45 to 0.85 times the area of the residual resin. Further preferably, the area ratio is 0.65 to 0.75 times.

The tip of the separating punch 11 is preferably formed as a quadrangle including square and rectangle or at least part of the tip is preferably formed with a curve including circle or ellipse. If such a shape is taken, then a ruptured face opened toward the boundary of the surface, which is opposite to the surface on which the tip of the residual resin separating punch is contacted, is formed more effectively in the residual resin.

The tip of the stripping punch 9 is preferably formed flat, and the tip area is preferably 0.45 to 0.85 times the area of residual resin. Further preferably, the area ratio is 0.65 to 0.75 times.

The tip of the stripping punch 9 is preferably formed as a quadrangle including square and rectangle or at least part of the tip is preferably formed with a curve including circle or ellipse. If such a shape is taken, then a pressing-through force is uniformly applied to the ruptured face of the separated resin piece, so that residual resin can be separated and swept more effectively.

Such way, before sweeping unnecessary overflowed resin by punches, the method and apparatus for sweeping overflowed resin according to this invention use such tools as a separating punch whose tip is smaller than residual resin to apply a breaking force from one end face to another end face of residual resin first (e.g., from bottom to top) and form a ruptured face due to a shearing stress inside the overflowed resin so that the overflowed resin is divided into a single separated resin piece and residual resin remained sticking, then applies a pressing-through force to the end face of the separated resin piece in the opposite direction of the breaking force (in this case, from top to bottom).

Consequently, the separated resin piece works as a kind of punch to press the residual resin via the whole ruptured face. This ruptured face, however, is formed by breaking the overflowed resin into a separated resin piece and a residual resin, so both the ruptured faces of the separated resin piece and the residual resin have an equal size. If the separated resin piece is regarded as a punch, therefore, the clearance between the punch and the lead, dam bar, or package becomes zero. As a result, the residual resin stuck on the side wall surface of the lead, dam bar, or package can be completely separated and swept or reduced significantly.

For example, even when a crack occurs from the side of the cutting edge of the punch, the residual resin can be reduced significantly as explained above. Thus, the separation and sweeping of unnecessary overflowed resin can be improved much more than the related art technique. Consequently, in the processes subsequent to the above sweeping process such as assembling and inspection, no problem will be caused by dropping off of the residual resin, which contributes to a smooth production with increased yield.

What is claimed is:

1. A method of removing overflowed resin in a semiconductor device manufacturing process, said method comprising the steps of:

causing a brittle rupture of overflowed resin formed between a pair of leads by applying a breaking force to the overflowed resin thereby forming a separated resin piece and a residual resin;

maintaining contact between said separated resin piece and said residual resin; and applying a pressing-through force to said separated resin piece in a direction opposite to said breaking force.

2. The method of claim 1, wherein the step of causing the brittle rupture comprises generating a force with a fluid pressure mechanism wherein the fluid is air, water, or oil.

3. The method of claim 2, wherein the step of applying a pressing-through force comprises generating said pressing-through force as an elastic force.

4. The method of claim 1, wherein the step of applying a pressing-through force comprises generating said pressing-through force as an elastic force.

* * * * *